United States Patent
Kinoshita et al.

(10) Patent No.: US 7,495,504 B2
(45) Date of Patent: Feb. 24, 2009

(54) REFERENCE VOLTAGE GENERATION CIRCUIT

(75) Inventors: Masayoshi Kinoshita, Osaka (JP); Shiro Sakiyama, Kyoto (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 10/588,191

(22) PCT Filed: Feb. 14, 2005

(86) PCT No.: PCT/JP2005/002159

§ 371 (c)(1),
(2), (4) Date: Aug. 2, 2006

(87) PCT Pub. No.: WO2005/101156

PCT Pub. Date: Oct. 27, 2005

(65) Prior Publication Data

US 2007/0132505 A1    Jun. 14, 2007

(30) Foreign Application Priority Data

Apr. 16, 2004 (JP) ............................. 2004-122075

(51) Int. Cl.
*G05F 1/10* (2006.01)
*G05F 3/02* (2006.01)

(52) U.S. Cl. .................. 327/539; 327/538; 327/540; 323/312; 323/313

(58) Field of Classification Search .................. 327/530, 327/538–546; 323/312–317
See application file for complete search history.

(56) References Cited

U.S. PATENT DOCUMENTS 6,018,235 A    1/2000    Mikuni (Continued)

FOREIGN PATENT DOCUMENTS

JP    2000-181554    6/2000

(Continued)

OTHER PUBLICATIONS

Design and Analysis of Integrator-Based Log-Domain Filter Circuits by Gordon W. Roberts, Vincent W. Leung http://books.google.com/books?id=g4A4yTP-TZ4C&pg=PA2&lpg=PA2&dq=transistor+acting+as+resistor&source=web&ots=rM3nE3NmCA&sig=hkD0mF3pX8NWFsBtQbw1ptGL0fQ#PPA3,M1.*

(Continued)

*Primary Examiner*—Long Nguyen
*Assistant Examiner*—Brandon S Cole
(74) *Attorney, Agent, or Firm*—McDermott Will & Emery LLP

(57) ABSTRACT

In a reference voltage generation circuit, a bandgap reference circuit (BGR circuit) 1 includes diode element D1 and D2 having different current densities, three resistive elements R1, R2 and R3, a P-type first transistor Tr1 for supplying a current to a reference voltage output terminal O, a P-type second transistor Tr2 for determining a drain current flowing through the first transistor Tr1 by a current mirror structure, and a feedback type control circuit 11. The BGR circuit 1 is connected to a pull-down circuit 2. The pull-down circuit 2 includes a resistive element R4 and a P-type transistor Tr4 which are connected in series. The resistive element R4 is connected to a drain terminal of the second P-type transistor Tr2. The P-type transistor Tr4 has a gate terminal connected to the reference voltage output terminal O and a grounded drain terminal. Thus, the number of elements and current consumption in the start-up circuit which shifts the operation from an abnormal stabilization point to a normal stabilization point are reduced.

1 Claim, 5 Drawing Sheets

U.S. PATENT DOCUMENTS

| | | | |
|---|---|---|---|
| 6,201,435 B1 * | 3/2001 | Chou | 327/543 |
| 6,891,433 B2 * | 5/2005 | Schrader | 330/253 |
| 2003/0080806 A1 | 5/2003 | Naoki | |

FOREIGN PATENT DOCUMENTS

| | | |
|---|---|---|
| JP | 3185698 | 5/2001 |
| JP | 2003-131749 | 5/2003 |

OTHER PUBLICATIONS

Diode Resistance http://www.geocities.com/tube_theory/Diode.htm?200828.*

* cited by examiner

1 BGR CIRCUIT
11 FEEDBACK TYPE CONTROL CIRCUIT
2 PULL DOWN CIRCUIT

1 BGR CIRCUIT
11 FEEDBACK TYPE CONTROL CIRCUIT
2C PULL DOWN CIRCUIT

1 BGR CIRCUIT
11 FEEDBACK TYPE CONTROL CIRCUIT
2D PULL DOWN CIRCUIT

REFERENCE VOLTAGE GENERATION CIRCUIT

RELATED APPLICATION

This application is a national phase of PCT/JP2005/002159 filed on Feb. 14, 2005, which claims priority from Japanese Application No. 2004-122075 filed on Apr. 16, 2004, the disclosures of which Applications are incorporated by reference herein. The benefit of the filing and priority dates of the International and Japanese Applications is respectfully requested.

TECHNICAL FIELD

The present invention relates to a reference voltage generation circuit for generating a constant voltage irrespective of a variation in supply voltage or temperature and specifically to a reference voltage generation circuit including a start-up circuit with which, even if the operation is stabilized at an abnormal stabilization point, the stabilization point is shifted to a normal stabilization point.

BACKGROUND ART

Conventionally, the reference voltage generation circuit which generates a constant voltage irrespective of a variation in supply voltage or temperature has been widely used in analog circuits, such as analog-digital converters, and the like.

An example of such a reference voltage generation circuit, illustrated in FIG. 7, has a band gap reference circuit 30 (hereinafter, abbreviated as "BGR circuit"). The BGR circuit 30 includes two diode elements D1 and D2 which have different current densities, three resistive elements R1, R2 and R3, a P-type first transistor Tr1 for supplying a current to a reference voltage output terminal O, a P-type second transistor Tr2 which determines a drain current flowing through the first transistor Tr1 by a current mirror structure, and a feedback type control circuit 31. The feedback type control circuit 31 is formed by a differential amplifier circuit 32 and an N-type transistor Tr3 and controls the drain current of the second transistor Tr2.

The feedback type control circuit 31 functions to stabilize the operation at a stabilization point at which the voltage at a node N1 (the connection point between the anode of the diode D1 and the resistive element R3) is equal to the voltage at a node N2 (the connection point between the resistive elements R1 and R2). For example, if the voltage at the node N1 is higher than that of the node N2, the gate voltage of the transistor Tr3 is increased by the differential amplifier circuit 32, so that the drain current of the transistor Tr3 is increased, and the drain current of the second transistor Tr2 is increased. As a result, the drain current I1 of the first transistor Tr1 is increased so that the output voltage of the reference voltage output terminal O is increased, and accordingly, the operation shifts to the operation stabilization point. On the contrary, if the voltage at the node N1 is lower than that of the node N2, the gate voltage of the transistor Tr3 is decreased by the differential amplifier circuit 32, so that the drain current of the transistor Tr3 is decreased, and the drain current of the second transistor Tr2 is decreased. As a result, the drain current I1 of the first transistor Tr1 is decreased so that the output voltage of the reference voltage output terminal O is decreased, and accordingly, the operation shifts to the operation stabilization point.

FIG. 8 illustrates the relationship between the output voltage of the reference voltage output terminal O and the voltages at the nodes N1 and N2. As seen from FIG. 8, the voltage at the node N1 is substantially constant so long as the voltage of the reference voltage output terminal O is equal to or higher than a predetermined output voltage irrespective of the output voltage value at the reference voltage output terminal O. Meanwhile, the voltage at the node N2 increases as the output voltage of the reference voltage output terminal O increases. Therefore, the plots of the voltages at the nodes N1 and N2 have an intersection point (normal stabilization point). The feedback type control circuit 31 allows the BGR circuit 30 to operate at the normal stabilization point. As a result, the BGR circuit 30 is enabled to generate an output voltage independent of the supply voltage.

The output voltage of the reference voltage output terminal O during the operation at the normal stabilization point is expressed by the following formula:

$$\text{Output Voltage} = Vd + kT/q \cdot R2/R1 \cdot \log(Is2/Is1 \cdot R2/R3)$$

where Vd is the voltage across the diode D1, k is Boltzmann constant, T is temperature, q is the amount of charges of electrons, and Is1 and Is2 are the saturation currents of the diode elements D1 and D2, respectively. Since voltage Vd across the diode D1 has a negative temperature characteristic, an output voltage independent of the temperature can be generated by setting Voltage Vd such that the resistance values of the resistive elements R1, R2 and R3 or the temperature characteristics of currents Is1 and Is2 of the diode elements are canceled with respect to the temperature characteristic of voltage Vd across the diode D1.

As described above, the BGR circuit 30 possesses the advantage of generating an output voltage independent of the supply voltage and temperature. However, as can be seen from FIG. 8, if the output voltage of the reference voltage output terminal O is in the lower range, drain current I1 supplied from the first transistor Tr1 is very small, and there is an abnormal stabilization point at which the plots of the voltages at the nodes N1 and N2 are crossing. Thus, the feedback type control circuit 31 sometimes controls the operation of the BGR circuit 30 at this abnormal stabilization point. In such a case, the output voltage of the reference voltage output terminal O is near the ground potential so that a desired voltage is not output. In view of such, the reference voltage generation circuit shown in FIG. 7 includes a start-up circuit 40 for the BGR circuit 30. When the operation is stabilized at the abnormal stabilization point, the start-up circuit 40 allows the BGR circuit 30 to shift its operation from the abnormal stabilization point to the normal stabilization point.

The conventional start-up circuit 40 has a structure as described in Patent Document 1. A current is supplied from a constant current source 15 to a diode element 16 to generate a diode voltage which is used for determining the normal stabilization point. This diode voltage is compared with the output voltage of the reference voltage output terminal O by a comparator circuit 17. If the output voltage of the reference voltage output terminal O is lower than the diode voltage, it is determined that the operation is at the abnormal stabilization point. Accordingly, a P-type transistor 18 is turned ON, and the drain current of the transistor 18 is supplied to the reference voltage output terminal O, whereby the output voltage is increased. Alternatively, a start-up circuit described in Patent Document 2 includes a voltage monitoring circuit for monitoring an output voltage. In this structure, if the voltage monitoring circuit determines that the operation is at the abnormal stabilization point, voltages are supplied to the reference voltage output terminal O and the node N1.

Thus, in the conventional start-up circuits, the output voltage of the reference voltage output terminal O is monitored all the time. In case of abnormal conditions, the voltage of the reference voltage output terminal O is increased such that the operation is shifted from the abnormal stabilization point to the normal stabilization point.

Patent Document 1: Gazette of Japanese Patent No. 3422706 (FIG. 1)
Patent Document 2: Gazette of Japanese Patent No. 3185698 (FIG. 1)

Disclosure of Invention

Problems to be Solved by the Invention

However, in the conventional start-up circuits, it is necessary to monitor the output voltage of the reference voltage output terminal O all the time, and therefore, the current is disadvantageously consumed by the monitoring circuit all the time. For example, in Patent Document 1, the currents are consumed by the current source 15 which generates the diode voltage and the comparator circuit 17 which compares the diode voltage with the output voltage. In Patent Document 2, the current is consumed by the voltage monitoring circuit which monitors the output voltage of the reference voltage output terminal. For example, in a battery-driven portable device including such a reference voltage generation circuit, such current consumptions disadvantageously shorten the battery duration of the portable device.

In the conventional start-up circuits, a relatively large number of semiconductor elements are used in the monitoring circuit, etc. For example, specifically, the comparator circuit 17 included in the start-up circuit 40 illustrated in FIG. 7 is realized by a differential amplifier circuit including a large number of semiconductor elements as shown in FIG. 9. To form such many semiconductor elements over a semiconductor substrate, it is necessary to secure a large area, which leads to high cost.

In view of the above circumstances, an objective of the present invention is to provide, in a reference voltage generation circuit, a start-up circuit which does not incur an increase in current consumption and which is capable of being realized by a smaller number of elements within a smaller circuit area.

Means for Solving the Problems

To solve the above problems, the present inventors noted the fact that, in the BGR circuit illustrated in FIG. 7, among the first and second P-type transistors which form a current mirror circuit, the drain current of the second P-type transistor Tr2 is zero at the abnormal stabilization point. In a reference voltage generation circuit according to the present invention, in the case of such a situation, the drain current of the second P-type transistor Tr2 is forced by the start-up circuit to flow. Then, this increase in drain current also increases the drain current of the first P-type transistor so that the output voltage of the reference voltage output terminal is increased. Accordingly, a large portion of the drain current of the second P-type transistor Tr2 flows into the feedback type control circuit. As a result, the current flowing into the start-up circuit is restricted to a small size. Specifically, a reference voltage generation circuit of the present invention is a reference voltage generation circuit for generating a constant reference voltage at a reference voltage output terminal, comprising: a first diode element having a cathode connected to a ground potential; a second diode element which has a current density different from that of the first diode element and whose cathode is connected to the ground potential; a first resistive element having an end connected to an anode of the second diode element; a second resistive element having an end connected to the other end of the first resistive element, the other end of the second resistive element being connected to the reference voltage output terminal; a third resistive element having an end connected to the anode of the first diode element and the other end connected to the reference voltage output terminal; a first P-type transistor for supplying a current to the reference voltage output terminal; a second P-type transistor having a gate terminal connected to its own drain terminal and to a gate terminal of the first P-type transistor; a bandgap reference circuit having a feedback type control circuit for controlling a drain current of the second P-type transistor such that a voltage at the anode of the first diode element is equal to a voltage at a connection point between the first and second resistive elements; and a start-up circuit for, if an output voltage of the reference voltage output terminal of the bandgap reference circuit is at an abnormal stabilization point, shifting the output voltage from the abnormal stabilization point to a normal stabilization point, wherein the start-up circuit is provided between the drain terminal of the second P-type transistor of the bandgap reference circuit and the ground potential, a current consumed by the start-up circuit is supplied from the drain terminal of the second P-type transistor, and if the drain current of the second P-type transistor is substantially zero, the start-up circuit increases the drain current of the second P-type transistor.

According to the present invention, in the reference voltage generation circuit, the start-up circuit is a P-type transistor whose gate terminal is connected to the reference voltage output terminal.

According to the present invention, in the reference voltage generation circuit, the start-up circuit includes: a P-type transistor having a gate terminal connected to the reference voltage output terminal; and a current generating element provided between a source terminal of the P-type transistor and a drain terminal of the second P-type transistor of the bandgap reference circuit.

According to the present invention, in the reference voltage generation circuit, the current generating element is a resistive element.

According to the present invention, in the reference voltage generation circuit, the current generating element is a diode element.

According to the present invention, in the reference voltage generation circuit, the current generating element is a transistor whose gate terminal is connected to a drain terminal.

According to the present invention, in the reference voltage generation circuit, the current generating element is a transistor whose gate terminal is fixed to a constant voltage.

With the above features of the present invention, when the bandgap reference circuit is at the abnormal stabilization point, the drain current of the second P-type transistor is substantially zero. However, since the start-up circuit increases the drain current, in the bandgap reference circuit, the drain current of the first P-type transistor increases, and the output voltage of the reference voltage output terminal also increases. Accordingly, the feedback type control circuit controls the output voltage of the reference voltage output terminal to be stabilized at the normal stabilization point. At this normal stabilization point, almost all of the drain current of the second P-type transistor flows into the feedback type control circuit, while the value of a current flowing into the start-up circuit is small, and therefore, the current consumption is small.

Specifically, according to the present invention, when the reference voltage output terminal is at the abnormal stabilization point, the voltage of the reference voltage output terminal is at a level near the ground potential. However, at this point in time, the P-type transistor included in the start-up circuit has a large gate-source voltage. Thus, the drain current of the second P-type transistor of the bandgap reference circuit is effectively increased, and as a result, the output voltage of the reference voltage output terminal quickly increases, so that the feedback type control circuit controls the bandgap reference circuit to operate at the normal stabilization point.

According to the present invention, the start-up circuit is formed by a series circuit consisting of a P-type transistor and a current generating circuit. Thus, the value of a current flowing through the start-up circuit can be limited to a value smaller than the value of the drain current of the first P-type transistor at the normal stabilization point of the bandgap reference circuit. Therefore, the operation at the normal stabilization point can readily be secured.

Effects of the Invention

As described above, according to a reference voltage generation circuit of the present invention, the start-up function can be realized without a substantial increase in current consumption, while relatively complicated circuits conventionally necessary, such as a comparator circuit, a voltage monitoring circuit, and the like, can be omitted, such that the number of elements and layout area are decreased, and accordingly, the size and cost of the circuit are decreased.

DESCRIPTION OF REFERENCE NUMERALS

1 BGR circuit
2, 2A to 2D Pull down circuit (Start-up circuit)
D1 First diode element
D2 Second diode element
D3 Diode element (Current generating element)
R1 First resistive element
R2 Second resistive element
R3 Third resistive element
R4 Resistive element (Current generating element)
O Reference voltage output terminal
Tr1 First P-type transistor
Tr2 Second P-type transistor
Tr3 Transistor
Tr4 P-type transistor
Tr5, Tr6 P-type transistor (Current generating element)
11 Feedback type control circuit
14 Differential amplifier circuit

BEST MODE FOR CARRYING OUT THE INVENTION

Hereinafter, embodiments of the present invention will be described with reference to the drawings.

Embodiment 1

Figure 1:
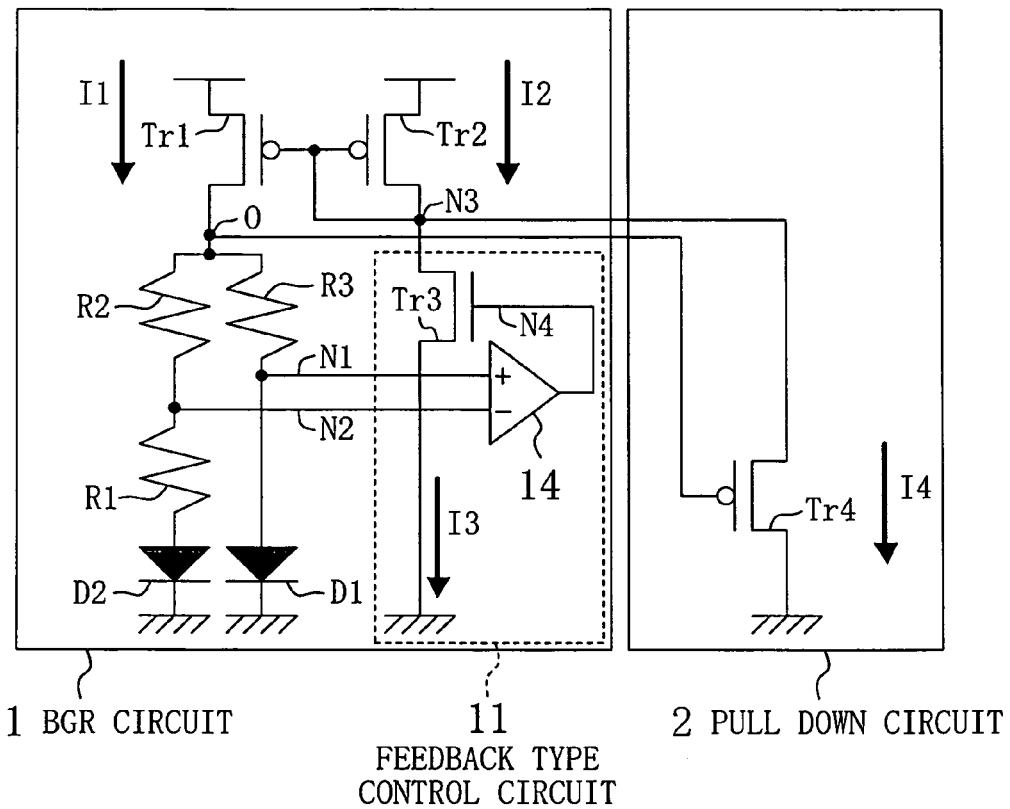
FIG. 1 is a circuit diagram showing a reference voltage generation circuit according to embodiment 1 of the present invention.

FIG. 1 shows a reference voltage generation circuit according to embodiment 1 of the present invention.

In FIG. 1, reference numeral 1 denotes a BGR circuit, and reference numeral 2 denotes a pull down circuit which serves as a start-up circuit. The BGR circuit 1 has a reference voltage output terminal O for outputting a constant reference voltage.

In the BGR circuit 1, reference numeral D1 denotes a first diode element, reference numeral D2 denotes a second diode element, reference numeral R1 denotes a first resistive element, reference numeral R2 denotes a second resistive element, reference numeral R3 denotes a third resistive element, reference numeral Tr1 denotes a P-type first transistor, reference numeral Tr2 denotes a P-type second transistor, and reference numeral 11 denotes a feedback type control circuit. The cathode of the first diode element D1 is connected to a ground potential. The current density of the second diode element D2 is different from that of the first diode element D1. The cathode of the second diode element D2 is connected to the ground potential. One end of the first resistive element R1 is connected to the anode of the second diode element D2. The other end of the first resistive element R1 is connected to one end of the second resistive element R2. The other end of the second resistive element R2 is connected to the reference voltage output terminal O. One end of the third resistive element R3 is connected to the anode of the first diode element D1. The other end of the third resistive element R3 is connected to the reference voltage output terminal O.

The first P-type transistor Tr1 has a source terminal connected to a power supply and a drain terminal connected to the reference voltage output terminal O and supplies a current to the reference voltage output terminal O. The second P-type transistor Tr2 and the first P-type transistor Tr1 form a current mirror circuit. The second P-type transistor Tr2 has a source terminal connected to the power supply and a gate terminal connected to its own drain terminal and to the gate terminal of the first P-type transistor Tr1. The second P-type transistor Tr2 determines drain current I1 flowing through the first P-type transistor Tr1. The feedback type control circuit 11 controls drain current I2 of the second P-type transistor Tr2 such that the voltage at the anode of the first diode element D1 (hereinafter, "node N1") is equal to the voltage at the connection point between the first resistive element R1 and the second resistive element R2 (hereinafter, "node N2"). The feedback type control circuit 11 has an N-type transistor Tr3 and a differential amplifier circuit 14. The transistor Tr3 has a source terminal connected to the ground potential and a drain terminal connected to the drain terminal of the second P-type transistor Tr2 (hereinafter, "node N3"). The voltages at the two nodes N1 and N2 are input to the differential amplifier circuit 14. The output of the differential amplifier circuit 14 is applied to the gate terminal of the transistor Tr3.

Figure 8:
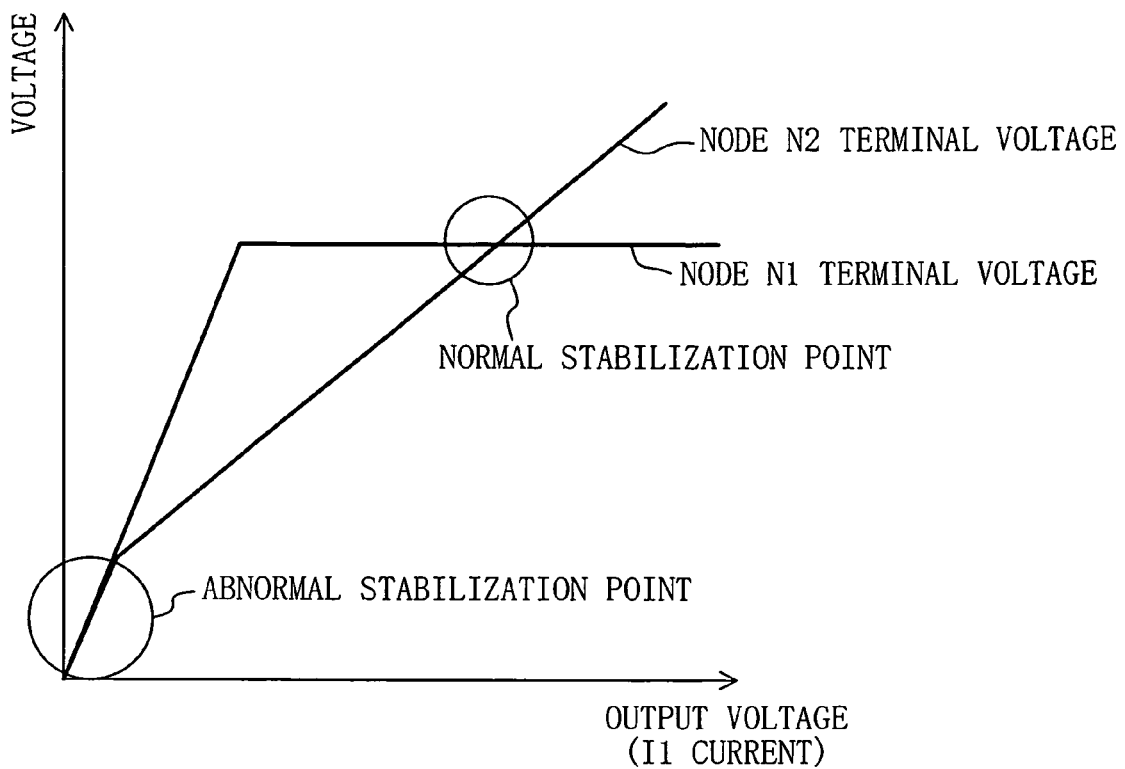
FIG. 8 is a graph illustrating abnormal stabilization point and normal stabilization point in a bandgap reference circuit.
Figure 9:
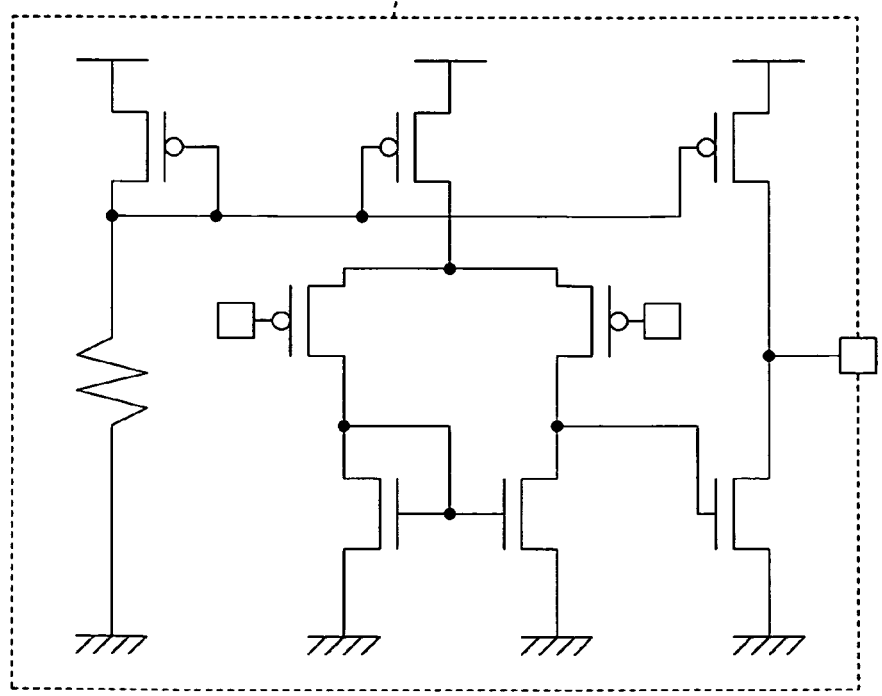
FIG. 9 is a circuit diagram showing a structure of a differential amplifier circuit used in a start-up circuit of the conventional reference voltage generation circuit.

When the output voltage of the reference voltage output terminal O of the BGR circuit 1 is at the abnormal stabilization point illustrated in FIG. 8, the pull down circuit 2 shifts the output voltage to the normal stabilization point. The pull down circuit 2 has a P-type transistor Tr4. The P-type transistor Tr4 is provided between the drain terminal of the second P-type transistor Tr2 of the BGR circuit 1 (i.e., node N3) and the ground potential. The gate terminal of the P-type transistor Tr4 is connected to the reference voltage output terminal O of the BGR circuit 1. When the value of drain current I2 of the second P-type transistor Tr2 of the BGR circuit 1 is substantially zero, the P-type transistor Tr4 increases drain current I2.

Figure 2:
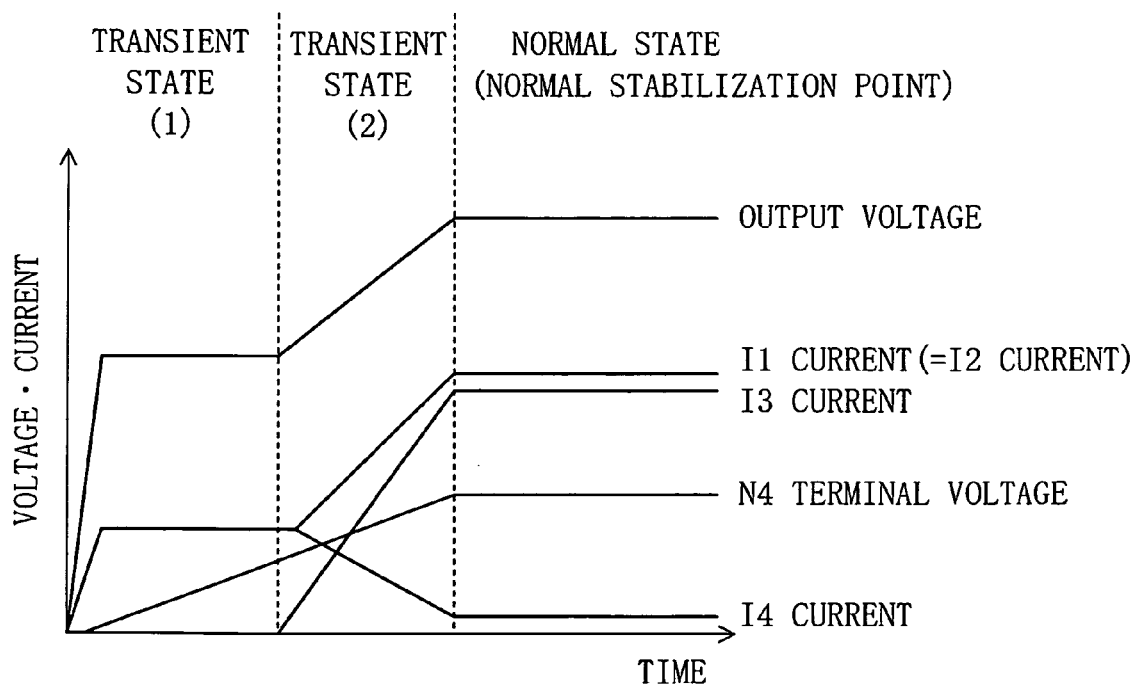
FIG. 2 is a graph which shows transitions of the output voltage, drain currents of transistors, etc., during the passage from abnormal stabilization point to normal stabilization point in the reference voltage generation circuit.

Now, the operation of this embodiment is described. It is assumed herein that the size of the first P-type transistor Tr1 is equal to that of the second P-type transistor Tr2 and that drain currents I1 and I2 of these transistors Tr1 and Tr2 satisfy the relationship of I1=I2 because of the current mirror structure. Hereinafter, the operation of the BGR circuit 1 shifting from the abnormal stabilization point to the normal stabilization point is described with reference to FIG. 1 and FIG. 2.

First, the operation is at the abnormal stabilization point, in which the output voltage of the reference voltage output terminal O is at a level near the ground potential. At this point in time, the voltage at the output terminal of the differential amplifier circuit 14 of the feedback type control circuit 11, i.e., the voltage at the gate terminal of the transistor Tr3 (node N4), is 0 V so that the transistor Tr3 is OFF. Therefore, drain current I3 of the transistor Tr3 is I3=I2=I1=0(A). Thus, the output voltage of the reference voltage output terminal O is maintained at the ground potential. Meanwhile, the drain terminal of the second P-type transistor Tr2 is pulled-up to the supply potential because the transistor Tr3 is OFF.

When the BGR circuit 1 is at the abnormal stabilization point as described above, in the pull down circuit 2, the gate terminal of the P-type transistor Tr4 is at the ground potential, the source terminal of the P-type transistor Tr4 is at the supply potential, and the gate-source voltage is at the supply potential. Accordingly, the transistor Tr4 is turned ON so that current I2 (=I4) starts to flow from the second P-type transistor Tr2 of the BGR circuit 1. Since the first P-type transistor Tr1 of the BGR circuit 1 generates a mirrored current of current I2 of the second P-type transistor Tr2, current I1 starts to flow through the first P-type transistor Tr1. As a result, the output voltage of the reference voltage output terminal O rises to an intermediate voltage between the abnormal stabilization point and the normal stabilization point.

When the output voltage of the reference voltage output terminal O rises to the intermediate voltage so that the voltage at the node N1 is higher than the voltage at the node N2, the differential amplifier circuit 14 of the feedback type control circuit 11 increases the gate voltage of the N-type transistor Tr3 such that the voltage at the node N1 is equal to the voltage at the node N2. Since the differential amplifier circuit 14 generally has a slow response speed because of reduction in current consumption, drain current I3 of the transistor Tr3 is zero (I3=0) before the voltage at the gate terminal of the transistor Tr3 (node N4) exceeds the threshold voltage of the transistor Tr3. This interval corresponds to Transient State (1) of FIG. 2.

Thereafter, when the gate voltage of the transistor Tr3 exceeds the threshold voltage of the transistor Tr3, drain current I3 starts to flow. Accordingly, drain current I1 of the first P-type transistor Tr1 starts to increase, and the output voltage of the reference voltage output terminal O increases. Since the increase of the output voltage of the reference voltage output terminal O results in a smaller gate-source voltage of the transistor Tr4 of the pull down circuit 2, drain current I4 of the transistor Tr4 decreases. This interval corresponds to Transient State (2) of FIG. 2.

When the output voltage of the reference voltage output terminal O then reaches a level corresponding to the normal stabilization point, the differential amplifier circuit 14 ceases the control of increasing the gate voltage of the transistor Tr3. Therefore, the output voltage of the reference voltage output terminal O becomes constant. This interval corresponds to Normal State of FIG. 2. In this interval, drain currents I1 to I4 of the four transistors Tr1 to Tr4 have the relationship of I1=I2=I3+I4. The increment of drain current I4 consumed by the pull down circuit 2 is equal to the decrement of drain current I3 of the transistor Tr3 of the BGR circuit 1. This means that the start-up function is realized without a substantial current increase.

In the above-described manner, drain current I2 of the second P-type transistor Tr2 of the BGR circuit 1 is also forced to flow through the pull down circuit 2 in addition to current I3 controlled by the feedback type control circuit 11. When current I4 flowing through the pull down circuit 2 increases, current I3 controlled by the feedback type control circuit 11 is decreased. On the contrary, when current I4 flowing through the pull down circuit 2 decreases, current I3 controlled by the feedback type control circuit 11 is increased by an amount corresponding to the decrement of current I4. In such a manner, the BGR circuit 1 can operate at the normal stabilization point all the time.

In this example, the pull down circuit 2 is realized by a single piece of transistor Tr4. Therefore, this embodiment provides the great benefit of layout area reduction.

Embodiment 2

Figure 3:
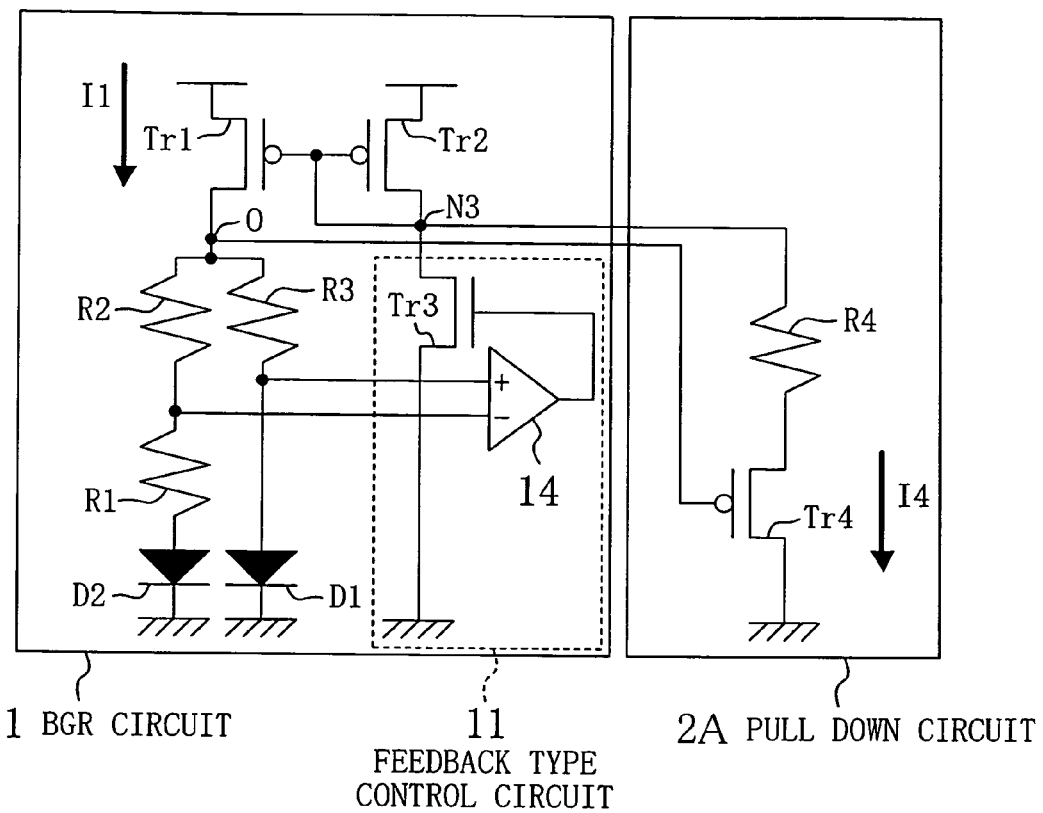
FIG. 3 is a circuit diagram showing a reference voltage generation circuit according to embodiment 2 of the present invention.

Embodiment 2 of the present invention is illustrated in FIG. 3.

If in embodiment 1 current I4 flowing through the pull down circuit 2 is greater than drain current I1 of the first P-type transistor Tr1 which is required in the BGR circuit 1 during the normal state, drain current I1 of the first P-type transistor Tr1 exceeds a current value which is required during the normal state, so that the BGR circuit 1 does not operate at the normal stabilization point. To avoid this trouble, it is necessary to optimize the transistor size of the P-type transistor Tr4 of the pull down circuit 2 such that current I4 flowing through the pull down circuit 2 is smaller than drain current I1 of the first P-type transistor Tr1 in the normal state. However, current I4 flowing through the P-type transistor Tr4 at the abnormal stabilization point is proportional to the square of the supply voltage which determines the gate-source voltage of the P-type transistor Tr4. Further, the fabrication process of the transistor is generally complicated so that the drain current readily varies. Because of such disadvantages, it is relatively difficult to determine the size of the P-type transistor Tr4 such that the above-described relationship of "current I4<current I1 in normal state" is satisfied.

In view of such, a pull down circuit 2A of embodiment 2 includes a resistive element (current generating element) R4 in addition to the P-type transistor Tr4 as illustrated in FIG. 3. This resistive element R4 has an end connected to the source terminal of the P-type transistor Tr4 and the other end connected to the drain terminal of the second P-type transistor Tr2 of the BGR circuit 1 (node N3).

In embodiment 2, the basic principle of the start-up function realized by the pull down circuit 2A is the same as that of embodiment 1. In embodiment 2, current I4 flowing through the pull down circuit 2A is determined by the resistance value of the resistive element R4. Specifically, current I4 flowing through the pull down circuit 2A has a value obtained by dividing the value of the following formula by the resistance value of the resistive element R4:

Voltage at node N3—(output voltage of reference voltage output terminal O—threshold voltage of transistor Tr4).

As a result, current I4 is proportional to the supply voltage (which determines the voltage at the node N3) raised to the first power. Thus, the design which satisfies the above-described relationship of "current I4<current I1 in normal state" is readily achieved.

Embodiment 3

Figure 4:
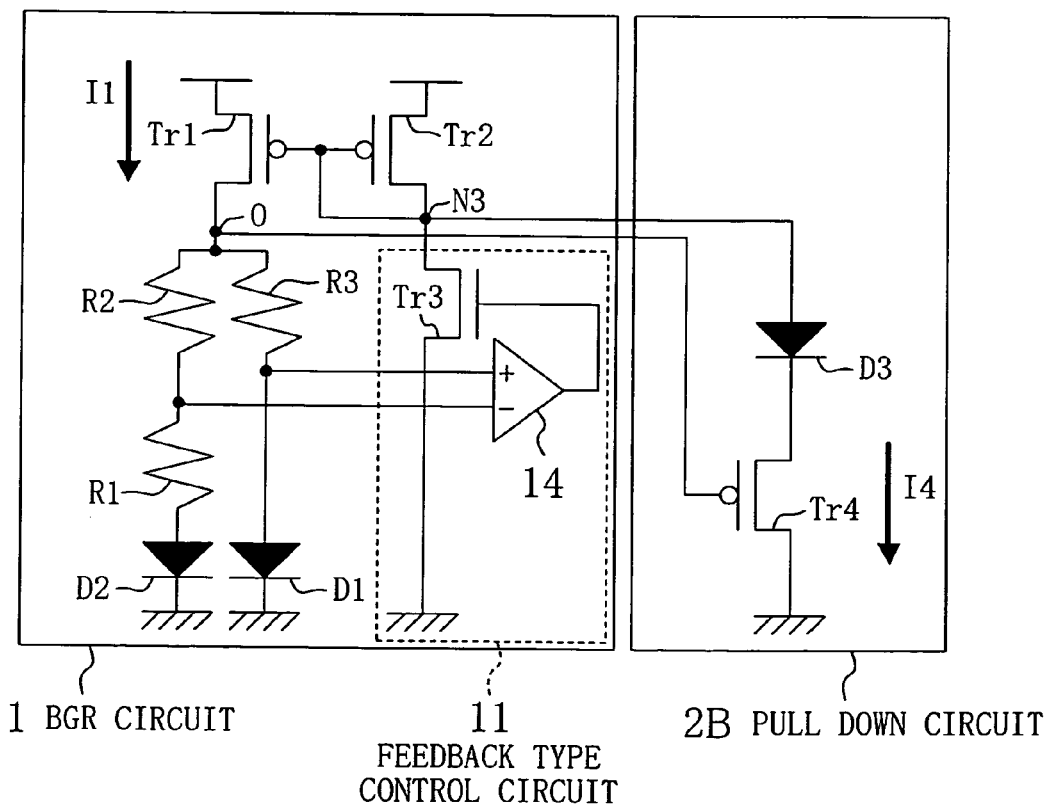
FIG. 4 is a circuit diagram showing a reference voltage generation circuit according to embodiment 3 of the present invention.

Embodiment 3 of the present invention is illustrated in FIG. 4.

In embodiment 3, a pull down circuit 2B is formed by connecting the P-type transistor Tr4 and a diode element (current generating element) D3 in series. The diode element D3 has an anode connected to the node N3 of the BGR circuit 1 and a cathode connected to the source terminal of the P-type transistor Tr4. The other components are the same as those of embodiment 1. Therefore, like elements are denoted by like reference numerals, and the descriptions thereof are herein omitted.

In embodiment 3, current I4 flowing through the pull down circuit 2B has a value obtained by dividing the value of the following formula by the interterminal impedance of the diode element D3:

Voltage at node N3—(output voltage of reference voltage output terminal O—threshold voltage of transistor Tr4).

In this case, the dependence on the power supply which determines the voltage of the node N3 of the BGR circuit 1 is large as compared with the example of embodiment 2 which uses the resistive element R4. However, since the diode element D3 generally has a small variation, the design which satisfies the above-described relationship of "current I4<current I1 in normal state" is more readily achieved.

Embodiment 4

Figure 5:
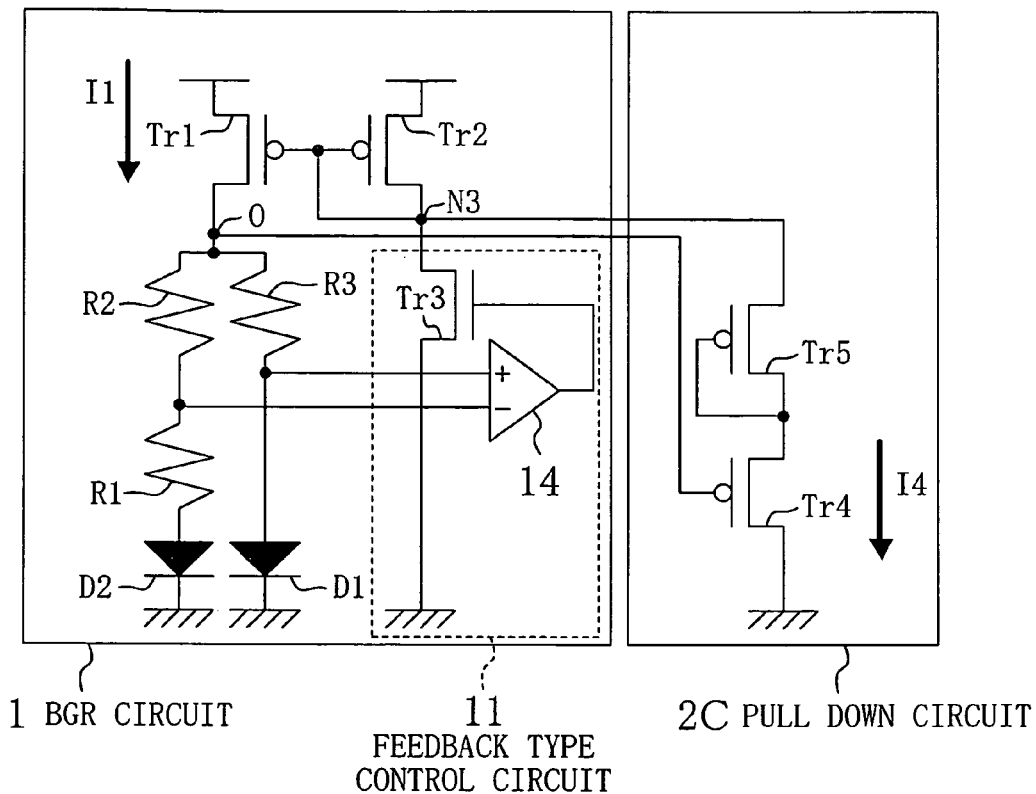
FIG. 5 is a circuit diagram showing a reference voltage generation circuit according to embodiment 4 of the present invention.

Embodiment 4 of the present invention is illustrated in FIG. 5.

In embodiment 4, a pull down circuit 2C is formed by connecting the P-type transistor Tr4 and another P-type transistor (current generating element) Tr5 in series. The P-type transistor Tr5 has a source terminal connected to the node N3 of the BGR circuit 1 and a drain terminal connected to its own gate terminal and to the source terminal of the P-type transistor Tr4.

In embodiment 4, current I4 flowing through the pull down circuit 2C has a value obtained by dividing the value of the following formula by the impedance between the source and drain terminals of the transistor Tr5:

Voltage at node N3—(output voltage of reference voltage output terminal O—threshold voltage of transistor Tr4).

In embodiment 4, the pull down circuit 2C can be constructed by only two transistors, i.e., the transistors Tr4 and Tr5. Therefore, it is not necessary to consider the characteristics of the resistive element R4 or the diode element D3 as is in embodiments 2 and 3.

Figure 6:
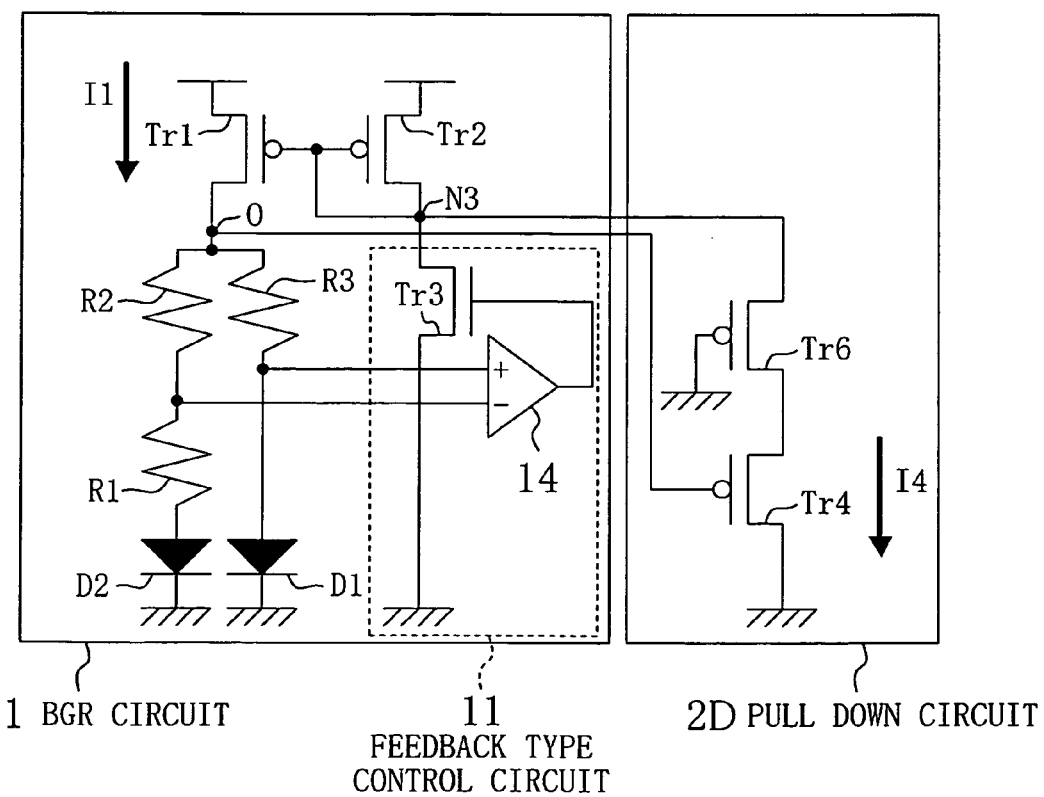
FIG. 6 is a circuit diagram showing a variation of the reference voltage generation circuit according to embodiment 4.
Figure 7:
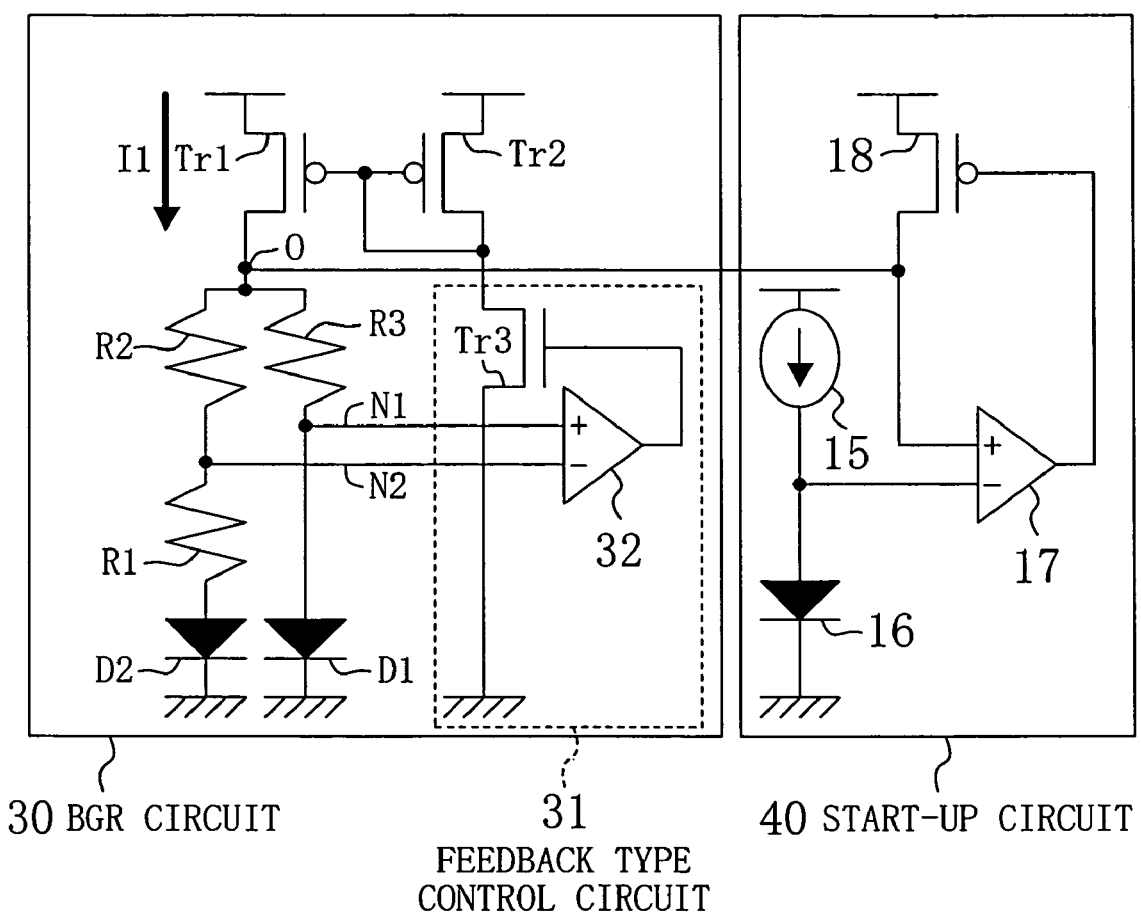
FIG. 7 is a circuit diagram showing an example of a conventional reference voltage generation circuit.

Although in embodiment 4 the gate terminal of the transistor Tr5 is connected to the drain terminal, a transistor (current generating element) Tr6 whose gate terminal is connected to a constantly fixed voltage, such as the ground, or the like, may be provided instead as shown in FIG. 6. The same function as that of embodiment 3 can also be realized even when the impedance between the source and drain of the transistor Tr6 is used.

INDUSTRIAL APPLICABILITY

As described above, according to the present invention, the start-up function can be realized by a smaller number of elements without increasing the current consumption. Therefore, in an application to a portable device, or the like, the life of a battery can be extended, while the layout area can be effectively reduced. Thus, the present invention is useful as a reference voltage generation circuit, or the like, which is effective for reduction in size and cost.

The invention claimed is:

1. A reference voltage generation circuit for generating a constant reference voltage at a reference voltage output terminal, comprising:
    a first diode element having a cathode connected to a ground potential;
    a second diode element which has a current density different from that of the first diode element and whose cathode is connected to the ground potential;
    a first resistive element having an end connected to an anode of the second diode element;
    a second resistive element having an end connected to the other end of the first resistive element, the other end of the second resistive element being connected to the reference voltage output terminal;
    a third resistive element having an end connected to an anode of the first diode element and the other end connected to the reference voltage output terminal;
    a first P-type transistor for supplying a current to the reference voltage output terminal;
    a second P-type transistor having a gate terminal connected to its own drain terminal and to a gate terminal of the first P-type transistor;
    a bandgap reference circuit having a feedback type control circuit for controlling a drain current of the second P-type transistor such that a voltage at the anode of the first diode element is equal to a voltage at a connection point between the first and second resistive elements; and
    a start-up circuit provided between the drain terminal of the second P-type transistor of the bandgap reference circuit and the ground potential, and increasing the drain current of the second P-type transistor, if the drain current of the second P-type transistor is substantially zero,
    wherein the start-up circuit includes:
        a P-type transistor having a gate terminal connected to the reference voltage output terminal; and
        a current generating element provided between a source terminal of the P-type transistor and a drain terminal of the second P-type transistor of the bandgap reference circuit and
    wherein the current generating element is a resistive element, and the current generating element is a transistor whose gate terminal is fixed to a constant voltage.

* * * * *